(12) United States Patent
Yun et al.

(10) Patent No.: US 9,130,567 B2
(45) Date of Patent: Sep. 8, 2015

(54) INVERTER DEVICE, NAND DEVICE, NOR DEVICE, AND LOGIC DEVICE INCLUDING THE SAME

(75) Inventors: Young-jun Yun, Seongnam-si (KR); Sang-wook Kim, Yongin-si (KR); Seong-jun Park, Seoul (KR); David Seo, Yongin-si (KR); Young-hee Yvette Lee, Seongnam-si (KR); Chang-seung Lee, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 9 days.

(21) Appl. No.: 13/599,483

(22) Filed: Aug. 30, 2012

(65) Prior Publication Data

US 2013/0168640 A1 Jul. 4, 2013

(30) Foreign Application Priority Data

Jan. 3, 2012 (KR) .................. 10-2012-0000645

(51) Int. Cl.
*H01L 29/06* (2006.01)
*H03K 19/20* (2006.01)

(52) U.S. Cl.
CPC ...................................... *H03K 19/20* (2013.01)

(58) Field of Classification Search
USPC ........................................ 257/29, E29.242, 99
See application file for complete search history.

(56) References Cited

U.S. PATENT DOCUMENTS

| | | | |
|---|---|---|---|
| 2010/0133511 A1* | 6/2010 | Zhou et al. | 257/24 |
| 2011/0062313 A1* | 3/2011 | Ludwig | 250/214 A |
| 2011/0089404 A1 | 4/2011 | Marcus et al. | |
| 2012/0129301 A1* | 5/2012 | Or-Bach et al. | 438/129 |
| 2013/0033310 A1* | 2/2013 | Liu | 327/581 |

* cited by examiner

*Primary Examiner* — Thanh T Nguyen
(74) *Attorney, Agent, or Firm* — Harness, Dickey & Pierce, P.L.C.

(57) ABSTRACT

An inverter device including a tunable diode device and a diode device that includes a control terminal connected to an input terminal of the inverter device, an anode terminal connected to a high-level voltage terminal, and a cathode terminal connected to an output terminal of the inverter device, wherein the diode device is configured to turn on or off according to a voltage applied to the control terminal.

10 Claims, 7 Drawing Sheets

INVERTER DEVICE, NAND DEVICE, NOR DEVICE, AND LOGIC DEVICE INCLUDING THE SAME

CROSS-REFERENCE TO RELATED APPLICATIONS

This application claims the benefit of Korean Patent Application No. 10-2012-0000645, filed on Jan. 3, 2012, in the Korean Intellectual Property Office, the disclosure of which is incorporated herein in its entirety by reference.

BACKGROUND

1. Field

The present disclosure relates to an inverter device, a NAND device and/or a NOR device. More particularly, the present disclosure relates to an inverter device, a NAND device and/or a NOR device that include graphene and/or a logic device including the inverter device, the NAND device and/or the NOR device.

2. Description of the Related Art

Graphene is a compound having a structure in which carbons are hexagonally combined and is a next-generation new material to replace a basic electronic material. In the graphene, electrons may have a movement speed at least 100 times faster than that of silicon so that the graphene is highlighted as a material capable of significantly increasing an information processing speed.

SUMMARY

Provided are an inverter device, a NAND device and/or a NOR device that include graphene, and/or a logic device including the inverter device, the NAND device, and/or the NOR device. In order to design a logic circuit by using graphene, it is desirable to develop a graphene transistor. However, due to a unique characteristic of graphene, when a transistor is manufactured by using the graphene, an on/off ratio of the graphene transistor is considerably decreased, compared to that of a silicon transistor, such that there is a limit in designing the logic circuit.

According to an example embodiment, an inverter device includes an input terminal and an output terminal, the inverter device configured to invert a signal from the input terminal, and output an inverted signal at the output terminal, and includes a diode device that includes a control terminal connected to the input terminal of the inverter device, an anode terminal connected to a logic high-level voltage terminal, and a cathode terminal connected to the output terminal of the inverter device, wherein the diode device is configured to turn on or off according to a voltage applied to the control terminal.

When a low-level voltage is applied to the control terminal, the diode device may be turned on, and when a logic high-level voltage is applied to the control terminal, the diode device may be turned off.

When a low-level voltage is applied to the input terminal, the diode device may be turned on, such that a logic high-level voltage may be output to the output terminal, and when a logic high-level voltage is applied to the input terminal, the diode device may be turned off, such that a low-level voltage may be output to the output terminal.

The inverter device may further include a resistive device that is connected between the output terminal and a low-level voltage terminal. When a low-level voltage is applied to the input terminal, the diode device may be turned on, and a current path may be formed from the logic high-level voltage terminal to the resistive device, such that a logic high-level voltage may be output to the output terminal, and when a logic high-level voltage is applied to the input terminal, the diode device may be turned off, and a current path may be formed from the low-level voltage terminal to the resistive device, such that a low-level voltage may be output to the output terminal.

According to another example embodiment, a NAND device includes a first input terminal, a second input terminal, and an output terminal, the NAND device configured to perform a NAND operation based on signals from the first and second input terminals and output a result of the NAND operation to the output terminal, and includes a first diode device including a first control terminal, a first anode terminal, and a first cathode terminal, the first diode device configured to turn on or off according to a voltage applied to the first control terminal; and a second diode device including a second control terminal, a second anode terminal, and a second cathode terminal, the second diode device configured to turn on or off according to a voltage applied to the second control terminal, wherein the first diode device and the second diode device are connected in parallel between a logic high-level voltage terminal and the output terminal.

The first control terminal of the first diode device may be connected to the first input terminal of the NAND device, the first anode terminal of the first diode device may be connected to the logic high-level voltage terminal, and the first cathode terminal of the first diode device may be connected to the output terminal of the NAND device, and the second control terminal of the second diode device may be connected to the second input terminal of the NAND device, the second anode terminal of the second diode device may be connected to the logic high-level voltage terminal, and the second cathode terminal of the second diode device may be connected to the output terminal of the NAND device.

When a low-level voltage is applied to the first control terminal, the first diode device may be turned on, and when a logic high-level voltage is applied to the first control terminal, the first diode device may be turned off, and when a low-level voltage is applied to the second control terminal, the second diode device may be turned on, and when a logic high-level voltage is applied to the second control terminal, the second diode device may be turned off.

When a low-level voltage is applied to at least one of the first input terminal and the second input terminal, at least one of the first diode device and the second diode device may be turned on, such that a logic high-level voltage may be output to the output terminal, and when a logic high-level voltage is applied to both the first input terminal and the second input terminal, both the first diode device and the second diode device may be turned off, such that a low-level voltage may be output to the output terminal.

The NAND device may further include a resistive device that is connected between the output terminal and a low-level voltage terminal. When a low-level voltage is applied to at least one of the first input terminal and the second input terminal, at least one of the first diode device and the second diode device may be turned on, and a current path may be formed from the logic high-level voltage terminal to the resistive device, such that a logic high-level voltage may be output to the output terminal, and when a logic high-level voltage is applied to both the first input terminal and the second input terminal, both the first diode device and the second diode device may be turned off, and a current path may be formed from the low-level voltage terminal to the resistive device, such that a low-level voltage may be output to the output terminal.

According to another example embodiment, a NOR device includes a first input terminal, a second input terminal, and an output terminal, the NOR device configured to perform a NOR operation based on signals from the first and second input terminals and output a result of the NOR operation to the output terminal, and includes a first diode device including a first control terminal, a first anode terminal, and a first cathode terminal, the first diode device is configured to turn on or off according to a voltage applied to the first control terminal; and a second diode device including a second control terminal, a second anode terminal, and a second cathode terminal, the second diode device is configured to turn on or off according to a voltage applied to the second control terminal, wherein the first diode device and the second diode device are connected in series between a logic high-level voltage terminal and the output terminal.

The first control terminal of the first diode device may be connected to the first input terminal of the NOR device, the first anode terminal of the first diode device may be connected to the logic high-level voltage terminal, and the first cathode terminal of the first diode device may be connected to the second anode terminal of the second diode device, and the second control terminal of the second diode device may be connected to the second input terminal of the NOR device, the second anode terminal of the second diode device may be connected to the first cathode terminal of the first diode device, and the second cathode terminal of the second diode device may be connected to the output terminal of the NOR device.

When a low-level voltage is applied to the first control terminal, the first diode device may be turned on, and when a logic high-level voltage is applied to the first control terminal, the first diode device may be turned off, and when a low-level voltage is applied to the second control terminal, the second diode device may be turned on, and when a logic high-level voltage is applied to the second control terminal, the second diode device may be turned off.

When a low-level voltage is applied to both the first input terminal and the second input terminal, both the first diode device and the second diode device may be turned on, such that a logic high-level voltage may be output to the output terminal, and when a logic high-level voltage is applied to at least one of the first input terminal and the second input terminal, the first diode device or the second diode device may be turned off, such that a low-level voltage may be output to the output terminal.

The NOR device may further include a resistive device that is connected between the output terminal and a low-level voltage terminal.

When a low-level voltage is applied to both the first input terminal and the second input terminal, both the first diode device and the second diode device may be turned on, and a current path may be formed from the logic high-level voltage terminal to the resistive device, such that a logic high-level voltage may be output to the output terminal, and when a logic high-level voltage is applied to at least one of the first input terminal and the second input terminal, the first diode device or the second diode device may be turned off, and a current path may be formed from the low-level voltage terminal to the resistive device, such that a low-level voltage may be output to the output terminal.

According to an example embodiment, a controlled inverter device includes a diode device that includes a control terminal connected to the input terminal of the inverter device, an anode terminal connected to a control signal, and a cathode terminal connected to the output terminal of the inverter device, wherein the diode device is configured to turn on or off according to a voltage applied to the control terminal and the control signal. The control signal may be a reference voltage. The control signal may also be a logic high-level voltage.

BRIEF DESCRIPTION OF THE DRAWINGS

These and/or other aspects will become apparent and more readily appreciated from the following description of the example embodiments, taken in conjunction with the accompanying drawings of which.

DETAILED DESCRIPTION

Figure 1:
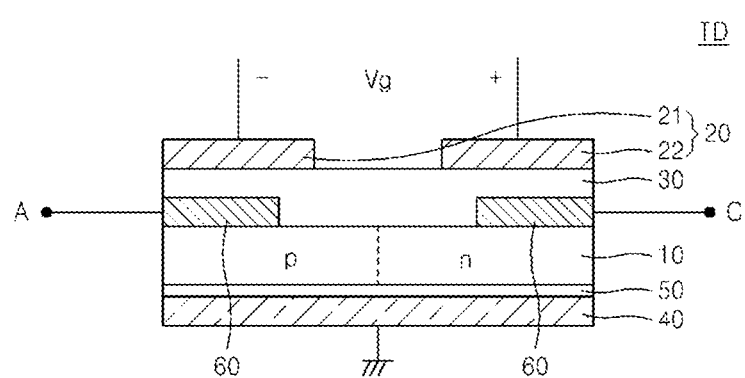
FIG. 1 is a cross-sectional view of a diode device according to an example embodiment.

Reference will now be made in detail to example embodiments, examples of which are illustrated in the accompanying drawings. In this regard, the present example embodiments may have different forms and should not be construed as being limited to the descriptions set forth herein. Rather, these example embodiments are provided so that this disclosure will be thorough and complete and will fully convey the concept of the invention to those skilled in the art. In the drawings, the size of each component may be exaggerated for clarity, and like reference numerals denote like elements.

Terms or words used in the following description may have common or general meanings in the art. For example, the term "at least one" means one or more, and thus may indicate a singular form or plural forms.

As used herein, the term "and/or" includes any and all combinations of one or more of the associated listed items.

Expressions such as "at least one of," when preceding a list of elements, modify the entire list of elements and do not modify the individual elements of the list.

Figure 2:
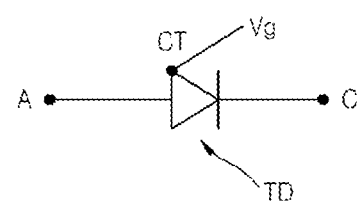
FIG. 2 is a circuit diagram of the diode device of FIG. 1.

FIG. 1 is a cross-sectional view of a diode device TD according to an example embodiment. FIG. 2 is a circuit diagram of the diode device TD of FIG. 1.

Referring to FIG. 1, the diode device TD may include a graphene layer 10, an upper gate electrode 20, an upper insulating layer 30, a lower gate electrode 40, a lower insulating layer 50, and anode/cathode electrodes 60.

The graphene layer 10 may include a single or composite layer formed of carbons. A current may flow in the graphene layer 10 and may be generated based on a selected one of two types of charge carriers (i.e., electrons and holes). The current that flows in the graphene layer 10 may be controlled by a control voltage Vg of the upper gate electrode 20 and/or the lower gate electrode 40.

The upper gate electrode 20 may be formed on a top surface of the graphene layer 10, and the lower gate electrode 40 may be formed on a bottom surface of the graphene layer 10. The upper insulating layer 30 may be formed between the upper gate electrode 20 and the anode/cathode electrodes 60, and between the upper gate electrode 20 and the graphene layer 10. The lower insulating layer 50 may be formed between the lower gate electrode 40 and the graphene layer 10.

The upper gate electrode 20 may include a first electrode 21 formed above a first region p of the graphene layer 10, and a second electrode 22 formed above a second region n of the graphene layer 10. The upper gate electrode 20 is a control terminal (refer to CT of FIG. 2) of the diode device TD, and a characteristic of the diode device TD may be changed by the control voltage Vg of the upper gate electrode 20.

The control voltage Vg that is received by the first electrode 21 and the second electrode 22 of the upper gate electrode 20 may change a characteristic of the graphene layer 10. For example, when a low-level voltage is applied to the first electrode 21, and a logic high-level voltage is applied to the second electrode 22, the first region p of the graphene layer 10 is changed to a p-type graphene region, and the second region n of the graphene layer 10 is changed to a n-type graphene region. Thus, the graphene layer 10 may form a p-n junction, thereby functioning as a p-n diode.

When a logic high-level voltage is applied to the first electrode 21, and a low-level voltage is applied to the second electrode 22, the first region p of the graphene layer 10 may be changed to a n-type graphene region, and the second region n of the graphene layer 10 may be changed to a p-type graphene region. A logic high-level voltage may be referred to as a high-level voltage.

As described above, a function of the diode device TD may be changed according to a variation of the control voltage Vg. However, in the present example embodiment, it is assumed that the low-level voltage is applied to the first electrode 21, the logic high-level voltage is applied to the second electrode 22, and a lower electrode is connected to a ground terminal, so that the diode device TD functions as the p-n diode including an anode terminal A and a cathode terminal C. FIG. 2 is the circuit diagram of the diode device TD according to the aforementioned assumption.

Referring to FIG. 2, the diode device TD may include the control terminal CT, the anode terminal A and the cathode terminal C. As described above, according to whether the control voltage Vg applied to the control terminal CT is positive or negative, a function of the diode device TD may be changed. For example, according to an increase of an absolute value of the control voltage Vg applied to the control terminal CT, built-potential in the diode device TD may be changed.

Figure 3:
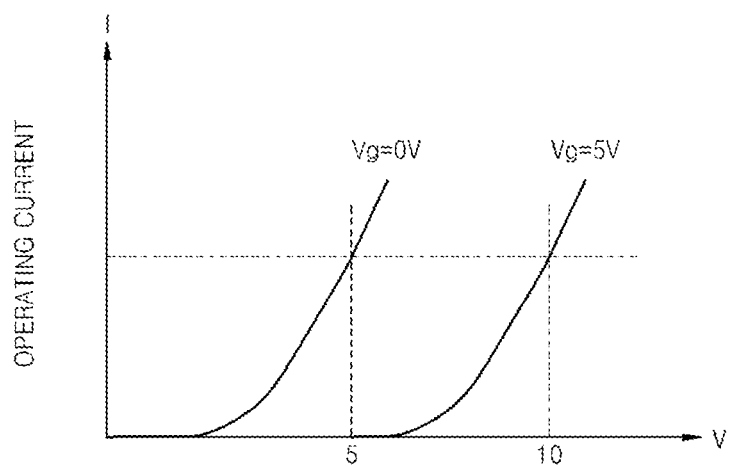
FIG. 3 is a graph of a voltage-current curve according to variation of a control voltage applied to a control terminal of the diode device of FIG. 2.

FIG. 3 is a graph of an I-V (current-voltage) curve according to variation of the control voltage Vg applied to the control terminal CT of the diode device TD of FIG. 2.

Referring to FIGS. 2 and 3, when the control voltage Vg is 0V, an internal voltage of the diode device TD is 0V. Thus, when an operating voltage of 5V is applied between the anode terminal A and the cathode terminal C, an operating current may flow in the diode device TD. When the control voltage Vg is 5V, the internal voltage of the diode device TD is 5V, thus, in order to overcome an energy barrier in the diode device TD, a voltage of at least 5V has to be applied between the anode terminal A and the cathode terminal C. In order to allow the operating current to flow in the diode device TD, a voltage of 10V that is the sum of the internal voltage (i.e., 5V) and the operating voltage (i.e., 5V) has to be applied between the anode terminal A and the cathode terminal C.

The diode device TD of FIG. 2 may operate or may not operate according to a variation of the control voltage Vg. For example, the diode device may function as a tunable diode device that is turned on or off according to the control voltage Vg.

Figure 4:
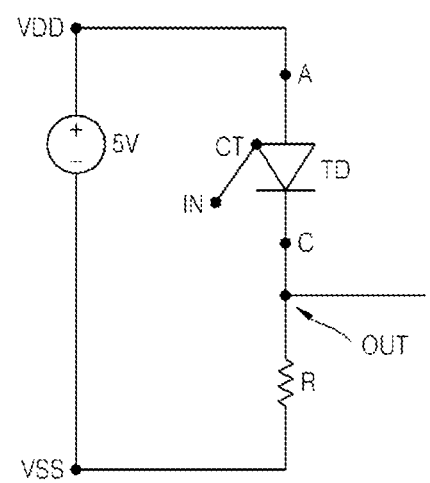
FIG. 4 is a circuit diagram of an inverter device, according to an example embodiment.

FIG. 4 is a circuit diagram of an inverter device, according to an example embodiment.

Referring to FIG. 4, the inverter device may include an input terminal IN, an output terminal OUT, and a diode device TD, and may perform an inversion function by inverting a signal of the input terminal IN and outputting it to the output terminal OUT.

It is necessary to note that a tunable diode device is used to embody the inverter device. For example, as illustrated in FIG. 2, the tunable diode device may correspond to the diode device TD including the control terminal CT, the anode terminal A and the cathode terminal C.

The control terminal CT of the diode device TD may be connected to the input terminal IN of the inverter device. Thus, according to an input voltage applied to the input terminal IN of the inverter device, the control voltage Vg that is applied to the control terminal CT of the diode device TD is changed, so that an internal voltage of the diode device TD is changed and then the diode device TD is turned on or off.

The anode terminal A of the diode device TD may be connected to a logic high-level voltage terminal VDD, and the cathode terminal C of the diode device TD may be connected to the output terminal OUT of the inverter device. A logic high-level voltage may be referred to as a high-level voltage. The high-level voltage terminal VDD may apply an internal voltage and/or an operating voltage to the diode device TD, and according to a voltage supplied from the high-level voltage terminal VDD, the diode device TD may be turned on or off, so that a high-level voltage or a low-level voltage may be output to the output terminal OUT.

For example, when the low-level voltage is applied to the control terminal CT of the diode device TD, the diode device TD has a low internal voltage. Since the anode terminal A of the diode device TD is connected to the high-level voltage terminal VDD, the diode device TD is turned on, so that the operating voltage flows from the anode terminal A of the diode device TD to the cathode terminal C. Thus, the high-level voltage may be output to the output terminal OUT of the inverter device.

When the high-level voltage is applied to the control terminal CT of the diode device TD, the diode device TD has a high internal voltage. Although the anode terminal A of the diode device TD is connected to the high-level voltage terminal VDD, a voltage that is applied from the high-level voltage terminal VDD to the anode terminal A is equal to or less than the internal voltage, so that the diode device TD is turned off. Thus, the low-level voltage may be output to the output terminal OUT.

As described above, the inverter device is configured in such a manner that the diode device TD is turned on or off according to an input voltage applied to the input terminal IN of the inverter device, and thus, an output voltage that is opposite to the input voltage may be output to the output terminal OUT, and by doing so, the inversion function of the inverter device may be performed.

The inverter device may further include a resistive device R that is connected between the output terminal OUT and a low-level voltage terminal VSS. The resistive device R may be embodied in various manners other than a general conductive line. For example, the resistive device R may be embodied by using a tunable diode device, and in this case, the tunable diode device may be configured to be turned on in response to a negative voltage.

Alternatively, the resistive device R may be embodied by using the diode device TD of FIG. 2. When the same negative voltage (or the same positive voltage) is applied to all of the first electrode 21 and the second electrode 22 of the upper gate electrode 20 of the diode device TD, all of the first region p of the graphene layer 10 and the second region n of the graphene layer 10 are changed to a p-type graphene region (or a n-type graphene region), and in this case, the graphene layer 10 may function as the resistive device R.

Operations of the inverter device of FIG. 4 will now be described in detail. It is assumed that 5V is applied to the logic high-level voltage terminal VDD, a ground voltage (i.e., 0V) is applied to the low-level voltage terminal VSS, the diode device TD operates according to a characteristic shown in FIG. 3, and a voltage drop due to the diode device TD can be ignored.

When an input voltage of the inverter device is 0V (i.e., a low-level voltage), an operating voltage of the diode device TD is 0V. The logic high-level voltage terminal VDD of 5V is delivered to the anode terminal A of the diode device TD, so that the diode device TD is turned on, and an operating current flows in the diode device TD. Thus, a current path may be formed from the logic high-level voltage terminal VDD to the resistive device R. By doing so, the output terminal OUT of the inverter device may be pulled-up to the logic high-level voltage terminal VDD of 5V, so that the input voltage of 0V may be inverted to an output voltage of 5V.

When the input voltage of the inverter device is 5V (i.e., a high-level voltage), the operating voltage of the diode device TD is 5V. Although the high-level voltage terminal VDD of 5V is delivered to the anode terminal A of the diode device TD, a voltage that is applied to the diode device TD is equal to or less than the operating voltage, so that the diode device TD is turned off. Thus, the current path may be formed from the low-level voltage terminal VSS to the resistive device R. By doing so, the output terminal OUT of the inverter device may be pulled-down to the low-level voltage terminal VSS of 0V, so that the input voltage of 5V may be inverted to an output voltage of 0V.

According to another example embodiment, the anode terminal A of the diode device TD may be connected to a control signal. The control signal may be a control signal, a reference voltage or a logic high-level voltage terminal VDD. According to a voltage supplied from the control signal, the diode device TD may be turned on or off, so that a logic high-level voltage or a logic low-level voltage may be output to the output terminal OUT.

When the control signal is low, the diode device is not turned on regardless of the input voltage of the inverter device. When the control signal is high (e.g., 5V), the diode device is turned on based on the input voltage of the inverter device as described above. When the control signal is greater than the internal voltage of the diode device, for example when the control signal is greater than the input voltage applied to the input terminal of the inverter device, the diode device is turned on regardless of the input voltage of the inverter device.

For example, if the control signal is 0V, the diode device is not turned on. If the control signal is 5V and the input voltage of the inverter device is 0V, the diode device is turned on, and an operating current flows in the diode device TD. Thus, a current path may be formed from the logic high-level voltage terminal VDD to the resistive device R. By doing so, the output terminal OUT of the inverter device may be pulled-up to the logic high-level voltage terminal VDD of 5V, so that the input voltage of 0V may be inverted to an output voltage of 5V. If the control signal is 5V and the input voltage of the inverter device is 5V, the voltage that is applied to the diode device TD is equal to or less than the operating voltage, so that the diode device TD is turned off. Thus, the current path may be formed from the low-level voltage terminal VSS to the resistive device R. By doing so, the output terminal OUT of the inverter device may be pulled-down to the low-level voltage terminal VSS of 0V, so that the input voltage of 5V may be inverted to an output voltage of 0V. Finally, if the control signal is 10V, the diode device is turned on whether the input voltage is 0V or 5V.

Figure 5:
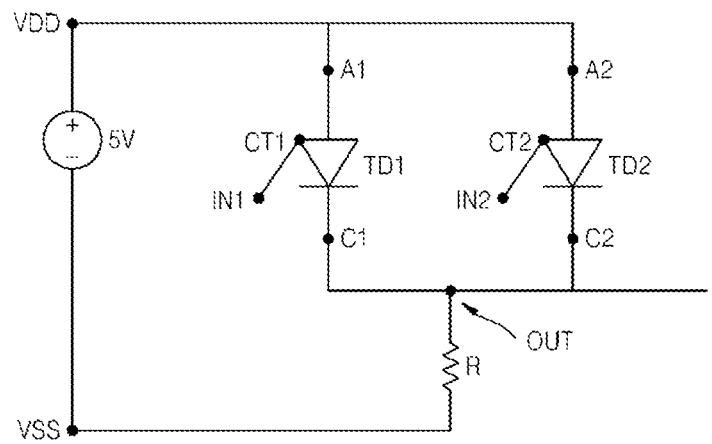
FIG. 5 is a circuit diagram of a NAND device, according to an example embodiment.

FIG. 5 is a circuit diagram of a NAND device, according to an example embodiment.

Referring to FIG. 5, the NAND device may include a first input terminal IN1, a second input terminal IN2, an output terminal OUT, a first diode device TD1, and a second diode device TD2, and may perform a NAND operation based on signals from the first input terminal IN1 and the second input terminal IN2 and then output a result of the NAND operation to the output terminal OUT.

It is necessary to note that the first diode device TD1 and the second diode device TD2 that are tunable diode devices are used to embody the NAND device. As illustrated in FIG. 2, the first diode device TD1 may include a first control terminal CT1, a first anode terminal A1, and a first cathode terminal C1, and the second diode device TD2 may include a second control terminal CT2, a second anode terminal A2, and a second cathode terminal C2.

The first control terminal CT1 of the first diode device TD1 may be connected to the first input terminal IN1 of the NAND device, and the second control terminal CT2 of the second diode device TD2 may be connected to the second input terminal IN2 of the NAND device. Thus, according to a first input voltage applied to the first input terminal IN1 of the NAND device, a first control voltage Vg that is applied to the first control terminal CT1 of the first diode device TD1 is changed. Thus, an internal voltage of the first diode device TD1 is changed so that the first diode device TD1 may be turned on or off. Similarly, according to a second input voltage applied to the second input terminal IN2 of the NAND device, a second control voltage Vg that is applied to the second control terminal CT2 of the second diode device TD2 is changed, thus, an internal voltage of the second diode device TD2 is changed so that the second diode device TD2 may be turned on or off.

The first diode device TD1 and the second diode device TD2 may be connected in parallel between a logic high-level voltage terminal VDD and the output terminal OUT of the NAND device. A logic high-level voltage may be referred to as a high-level voltage. For example, the first anode terminal A1 of the first diode device TD1 may be connected to the high-level voltage terminal VDD, and the first cathode terminal C1 of the first diode device TD1 may be connected to the output terminal OUT of the NAND device. The second anode terminal A2 of the second diode device TD2 may be connected to the high-level voltage terminal VDD, and the second cathode terminal C2 of the second diode device TD2 may be connected to the output terminal OUT of the NAND device.

The high-level voltage terminal VDD may apply internal voltages and/or operating voltages to the first diode device TD1 and to the second diode device TD2, and according to a voltage supplied from the high-level voltage terminal VDD, the first diode device TD1 and/or the second diode device TD2 may be turned on or off.

For example, when a low-level voltage is applied to at least one of the first control terminal CT1 of the first diode device TD1 and the second control terminal CT2 of the second diode device TD2, at least one of the first diode device TD1 and the second diode device TD2 has a low internal voltage. Since the first anode terminal A1 of the first diode device TD1, and the second anode terminal A2 of the second diode device TD2 are connected to the high-level voltage terminal VDD, at least one of the first diode device TD1 and the second diode device TD2 is turned on, so that an operating current flows from the first anode terminal A1 of the first diode device TD1 to the first cathode terminal C1 or flows from the second anode terminal A2 of the second diode device TD2 to the second cathode terminal C2. Thus, a high-level voltage may be output to the output terminal OUT of the NAND device.

When a high-level voltage is applied to all of the first control terminal CT1 of the first diode device TD1 and the second control terminal CT2 of the second diode device TD2, the first diode device TD1 and the second diode device TD2 have a high internal voltage. Although the first anode terminal A1 of the first diode device TD1 and the second anode terminal A2 of the second diode device TD2 are connected to the high-level voltage terminal VDD, a voltage that is applied from the high-level voltage terminal VDD to the first anode terminal A1 and the second anode terminal A2 is equal to or less than the internal voltage, so that all of the first diode device TD1 and the second diode device TD2 are turned off. Thus, a low-level voltage may be output to the output terminal OUT of the NAND device.

As described above, the NAND device may perform a NAND operation by outputting a low-level voltage only for a case in which both the first input voltage applied to the first input terminal IN1 and the second input voltage applied to the second input terminal IN2 are a high-level voltage, and then by outputting a high-level voltage for other cases.

The NAND device may further include a resistive device R that is connected between the output terminal OUT and a low-level voltage terminal VSS. As described above, the resistive device R may be embodied in various manners other than a general conductive line.

Operations of the NAND device of FIG. 5 will now be described in detail. It is assumed that 5V is applied to the high-level voltage terminal VDD, a ground voltage (i.e., 0V) is applied to the low-level voltage terminal VSS, the first diode device TD1 and the second diode device TD2 operate according to a characteristic shown in FIG. 3, and a voltage drop due to the first diode device TD1 and the second diode device TD2 can be ignored.

When the first input voltage of the NAND device is 0V (i.e. a low-level voltage), and the second input voltage of the NAND device is 0V (i.e. a low-level voltage), an operating voltage of the first diode device TD1 and an operating voltage of the second diode device TD2 are both 0V. The high-level voltage terminal VDD of 5V is delivered to the first anode terminal A1 of the first diode device TD1, and the second anode terminal A2 of the second diode device TD2, so that the first diode device TD1 and the second diode device TD2 are turned on, and an operating current flows in the first diode device TD1 and the second diode device TD2. A current path may be formed from the high-level voltage terminal VDD to the resistive device R, and the output terminal OUT of the NAND device may be pulled-up to the high-level voltage terminal VDD of 5V. Thus, a high-level voltage is output to the output terminal OUT of the NAND device. By doing so, the NAND device may generate a logic output of 1 with respect to a logic input of (0, 0).

When the first input voltage of the NAND device is 5V (i.e. a high-level voltage), and the second input voltage of the NAND device is 0V (i.e. a low-level voltage), the operating voltage of the first diode device TD1 is 5V, and the operating voltage of the second diode device TD2 is 0V. Although the high-level voltage terminal VDD of 5V is delivered to the first anode terminal A1 of the first diode device TD1, a voltage applied to the first diode device TD1 is equal to or less than the operating voltage, so that the first diode device TD1 is turned off. On the other hand, since the high-level voltage terminal VDD of 5V is delivered to the second anode terminal A2 of the second diode device TD2, the second diode device TD2 is turned on, and an operating current flows in the second diode device TD2. A current path may be formed from the high-level voltage terminal VDD to the resistive device R, and the output terminal OUT of the NAND device may be pulled-up to the high-level voltage terminal VDD of 5V. Thus, a high-level voltage is output to the output terminal OUT of the NAND device. By doing so, the NAND device may generate a logic output of 1 with respect to a logic input of (1, 0).

When at least one of the first input voltage and the second input voltage is a low-level voltage, at least one of the first diode device TD1 and the second diode device TD2 that are connected in parallel is turned on, so that the current path may be formed from the high-level voltage terminal VDD to the resistive device R, and the high-level voltage may be output to the output terminal OUT of the NAND device. Thus, in a case where the first input voltage of the NAND device is 0V (i.e., the low-level voltage), and the second input voltage of the NAND device is 5V (i.e., the high-level voltage), similar to the case where the first input voltage of the NAND device is 5V (i.e., the high-level voltage) and the second input voltage of the NAND device is 0V (i.e., the low-level voltage), the output terminal OUT of the NAND device may be pulled-up to the high-level voltage terminal VDD of 5V. Thus, the NAND device may generate a logic output of 1 with respect to a logic input of (0, 1).

When the first input voltage of the NAND device is 5V (i.e., the high-level voltage), and the second input voltage of the NAND device is 5V (i.e., the high-level voltage), an operating voltage of the first diode device TD1 and the second diode device TD2 is 5V. Although the high-level voltage terminal VDD of 5V is delivered to the first anode terminal A1 of the first diode device TD1 and the second anode terminal A2 of the second diode device TD2, a voltage applied to the first diode device TD1 and the second diode device TD2 is equal to or less than the operating voltage, so that both the first diode device TD1 and the second diode device TD2 are turned off. Thus, a current path is not formed from the high-level voltage terminal VDD to the output terminal OUT of the NAND device, rather, a current path is formed from the low-level voltage terminal VSS to the resistive device R, so that the output terminal OUT of the NAND device may be pulled-down to the low-level voltage terminal VSS of 0V. Thus, a low-level voltage is output to the output terminal OUT of the NAND device. By doing so, the NAND device may generate a logic output of 0 with respect to a logic input of (1, 1).

Figure 6:
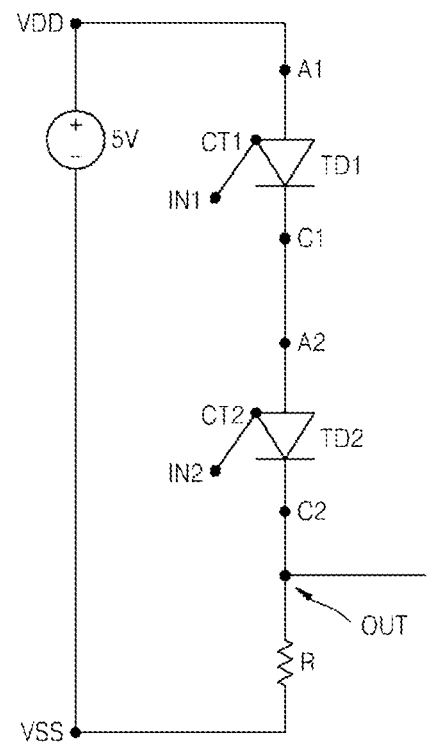
FIG. 6 is a circuit diagram of a NOR device, according to an example embodiment.

FIG. 6 is a circuit diagram of a NOR device, according to an example embodiment.

Referring to FIG. 6, the NOR device may include a first input terminal IN1, a second input terminal IN2, an output terminal OUT, a first diode device TD1, and a second diode device TD2, and may perform a NOR operation based on signals from the first input terminal IN1 and the second input terminal IN2 and then output a result of the NOR operation to the output terminal OUT.

It is necessary to note that the first diode device TD1 and the second diode device TD2 that are tunable diode devices are used to embody the NOR device. As illustrated in FIG. 2, the first diode device TD1 may include a first control terminal CT1, a first anode terminal A1, and a first cathode terminal C1, and the second diode device TD2 may include a second control terminal CT2, a second anode terminal A2, and a second cathode terminal C2.

The first control terminal CT1 of the first diode device TD1 may be connected to the first input terminal IN1 of the NOR device, and the second control terminal CT2 of the second diode device TD2 may be connected to the second input terminal IN2 of the NOR device. Thus, according to a first input voltage applied to the first input terminal IN1 of the NOR device, a first control voltage Vg that is applied to the first control terminal CT1 of the first diode device TD1 is changed. Thus, an internal voltage of the first diode device TD1 is changed so that the first diode device TD1 may be turned on or off. Similarly, according to a second input voltage applied to the second input terminal IN2 of the NOR device, a second control voltage Vg that is applied to the second control terminal CT2 of the second diode device TD2 is changed. Thus, an internal voltage of the second diode device TD2 is changed so that the second diode device TD2 may be turned on or off.

The first diode device TD1 and the second diode device TD2 may be connected in series between a logic high-level voltage terminal VDD and the output terminal OUT of the NOR device. A logic high-level voltage may be referred to as a high-level voltage. For example, the first anode terminal A1 of the first diode device TD1 may be connected to the high-level voltage terminal VDD, and the first cathode terminal C1 of the first diode device TD1 may be connected to the second anode terminal A2 of the second diode device TD2. The second anode terminal A2 of the second diode device TD2 may be connected to the first cathode terminal C1 of the first diode device TD1, and the second cathode terminal C2 of the second diode device TD2 may be connected to the output terminal OUT of the NOR device.

The high-level voltage terminal VDD may apply internal voltages and/or operating voltages to the first diode device TD1 and to the second diode device TD2, and according to a voltage supplied from the high-level voltage terminal VDD, the first diode device TD1 and/or the second diode device TD2 may be turned on or off.

For example, when a high-level voltage is applied to at least one of the first control terminal CT1 of the first diode device TD1 and the second control terminal CT2 of the second diode device TD2, at least one of the first diode device TD1 and the second diode device TD2 has a high internal voltage. Although the first diode device TD1 and the second diode device TD2 are connected to the high-level voltage terminal VDD, a voltage that is applied from the high-level voltage terminal VDD to at least one of the first diode device TD1 and the second diode device TD2 is equal to or less than the internal voltage, so that at least one of the first diode device TD1 and the second diode device TD2 is turned off. Thus, since at least one of the first diode device TD1 and the second diode device TD2 that are connected in series is turned off, a low-level voltage may be output to the output terminal OUT of the NOR device.

When a low-level voltage is applied to both the first control terminal CT1 of the first diode device TD1 and the second control terminal CT2 of the second diode device TD2, the first diode device TD1 and the second diode device TD2 have a low internal voltage. Since the first diode device TD1 and the second diode device TD2 are connected to the high-level voltage terminal VDD, both the first diode device TD1 and the second diode device TD2 are turned on, so that an operating current flows from the first anode terminal A1 of the first diode device TD1 to the first cathode terminal C1, and an operating current flows from the second anode terminal A2 of the second diode device TD2 to the second cathode terminal C2. Thus, a high-level voltage may be output to the output terminal OUT of the NOR device.

As described above, the NOR device may perform a NOR operation by outputting a high-level voltage only for a case in which the first input voltage applied to the first input terminal IN1 and the second input voltage applied to the second input terminal IN2 are a low-level voltage, and then by outputting a low-level voltage for other cases other than the case.

The NOR device may further include a resistive device R that is connected between the output terminal OUT and a low-level voltage terminal VSS. As described above, the resistive device R may be embodied in various manners other than a general conductive line.

Operations of the NOR device of FIG. 6 will now be described in detail. It is assumed that 5V is applied to the high-level voltage terminal VDD, a ground voltage (i.e., 0V) is applied to the low-level voltage terminal VSS, the first diode device TD1 and the second diode device TD2 operate according to a characteristic shown in FIG. 3, and a voltage drop due to the first diode device TD1 and the second diode device TD2 can be ignored.

When the first input voltage of the NOR device is 0V (i.e. a low-level voltage), and the second input voltage of the NOR device is 0V (i.e. a low-level voltage), an operating voltage of the first diode device TD1 and an operating voltage of the second diode device TD2 are all 0V. The high-level voltage terminal VDD of 5V is delivered to the first anode terminal A1 of the first diode device TD1, and the second anode terminal A2 of the second diode device TD2, so that the first diode device TD1 and the second diode device TD2 are turned on, and an operating current flows in the first diode device TD1 and the second diode device TD2. A current path may be formed from the high-level voltage terminal VDD to the resistive device R, and the output terminal OUT of the NOR device may be pulled-up to the high-level voltage terminal VDD of 5V. Thus, a high-level voltage is output to the output terminal OUT of the NOR device. By doing so, the NOR device may generate a logic output of 1 with respect to a logic input of (0, 0).

When the first input voltage of the NOR device is 5V (i.e. a high-level voltage), and the second input voltage of the NOR device is 0V (i.e. a low-level voltage), the operating voltage of the first diode device TD1 is 5V, and the operating voltage of the second diode device TD2 is 0V. Although the high-level voltage terminal VDD of 5V is delivered to the first anode terminal A1 of the first diode device TD1, a voltage applied to the first diode device TD1 is equal to or less than the operating voltage, so that the first diode device TD1 is turned off. Since the first diode device TD1 is turned off, the high-level voltage terminal VDD of 5V is not delivered to the output terminal OUT of the NOR device, regardless of whether the second diode device TD2 is turned on or off. A current path may be formed from the low-level voltage terminal VSS to the resistive device R, and the output terminal OUT of the NOR device may be pulled-down to the low-level voltage terminal VSS of 0V. Thus, a low-level voltage is output to the output terminal OUT of the NOR device. By doing so, the NOR device may generate a logic output of 0 with respect to a logic input of (1, 0).

When at least one of the first input voltage and the second input voltage of the NOR device has a high-level voltage, at least one of the first diode device TD1 and the second diode device TD2 is turned off, so that the high-level voltage terminal VDD of 5V is not delivered to the output terminal OUT of the NOR device. The current path may be formed from the low-level voltage terminal VSS to the resistive device R, and the output terminal OUT of the NOR device may be pulled-down to the low-level voltage terminal VSS of 0V. Thus, the low-level voltage is output to the output terminal OUT of the NOR device.

Thus, in a case where the first input voltage of the NOR device is 0V (i.e., the low-level voltage), and the second input voltage of the NOR device is 5V (i.e., the high-level voltage), similar to the case where the first input voltage of the NOR device is 5V (i.e., the high-level voltage) and the second input voltage of the NOR device is 0V (i.e., the low-level voltage), the output terminal OUT of the NOR device may be pulled-down to the low-level voltage terminal VSS of 0V. By doing so, the NOR device may generate a logic output of 0 with respect to a logic input of (0, 1).

In a case where the first input voltage of the NOR device is 5V (i.e., the high-level voltage), and the second input voltage of the NOR device is 5V (i.e., the high-level voltage), similar to the case where the first input voltage of the NOR device is 5V (i.e., the high-level voltage) and the second input voltage of the NOR device is 0V (i.e., the low-level voltage), the output terminal OUT of the NOR device may be pulled-down to the low-level voltage terminal VSS of 0V. By doing so, the NOR device may generate a logic output of 0 with respect to a logic input of (1, 1).

Figure 7:
FIGS. 7 through 9 are circuit diagrams of a logic device, according to an example embodiment.
Figure 8:
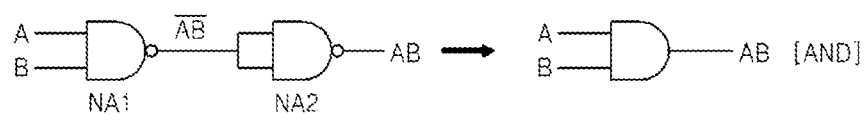
Figure 9:
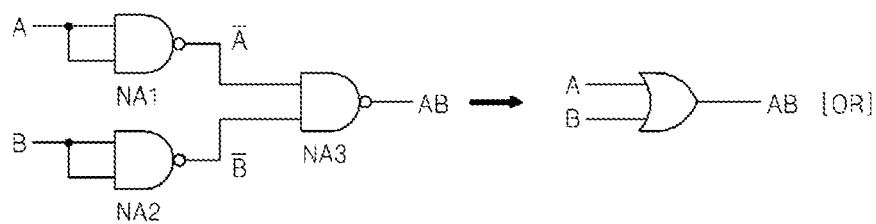

FIGS. 7 through 9 are circuit diagrams of a logic device, according to an example embodiment.

Referring to FIGS. 7 through 9, the logic device may be embodied by using the NAND device according to the previous example embodiment. As illustrated in FIG. 7, when input terminals of the NAND device are connected to each other, the NAND device may function as an inverter device that inverts a random input A As illustrated in FIG. 8, an AND device may be embodied in a manner that a random first input A and a random second input B are input to a first NAND device NA1, and then an output from the first NAND device NA1 is input to an inverter device NA2 by using the NAND device of FIG. 7

As illustrated in FIG. 9, an OR device may be embodied in a manner that a random first input A is input to a first inverter device NA1 by using the NAND device of FIG. 7, a random second input B is input to a second inverter device NA2 by using the NAND device of FIG. 7, and then an output from the first inverter device NA1 and an output from the second inverter device NA2 are input to a third NAND device NA3.

While the logic device may be embodied by using various types of circuits including the inverter device, the AND device, the OR device, or the like, the various types of circuits may be embodied by using a NAND device. Thus, the various types of circuits may be embodied by using the NAND device according to the one or more example embodiments.

Figure 10:
FIGS. 10 through 12 are circuit diagrams of a logic device, according to another example embodiment.
Figure 11:
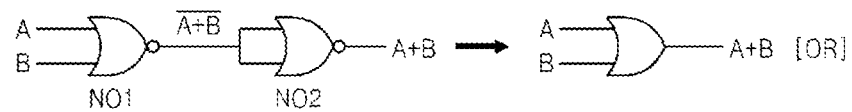
Figure 12:
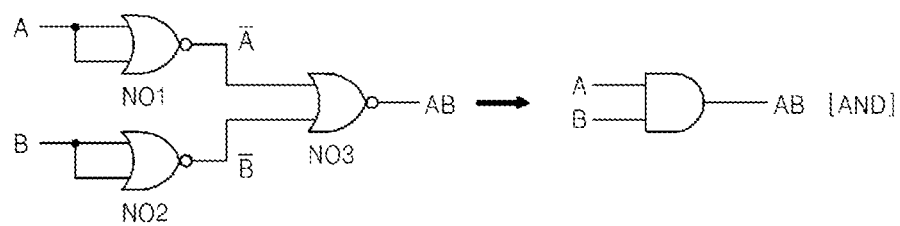

FIGS. 10 through 12 are circuit diagrams of a logic device, according to another example embodiment.

Referring to FIGS. 10 through 12, the logic device may be embodied by using the NOR device according to the previous example embodiment. As illustrated in FIG. 10, when input terminals of the NOR device are connected to each other, the NOR device may function as an inverter device that inverts a random input A As illustrated in FIG. 11, an OR device may be embodied in a manner that a random first input A and a random second input B are input to a first NOR device N01, and then an output from the first NOR device NO1 is input to an inverter device NO2 by using the NOR device of FIG. 10.

As illustrated in FIG. 12, an AND device may be embodied in a manner that a random first input A is input to a first inverter device NO1 by using the NOR device of FIG. 10, a random second input B is input to a second inverter device NO2 by using the NOR device of FIG. 10, and then an output from the first inverter device NO1 and an output from the second inverter device NO2 are input to a third NOR device NO3.

As illustrated in FIGS. 10 through 12, various types of circuits may be embodied by using a NOR device. Thus, the various types of circuits may be embodied by using the NOR device according to the one or more example embodiments.

Figure 13:
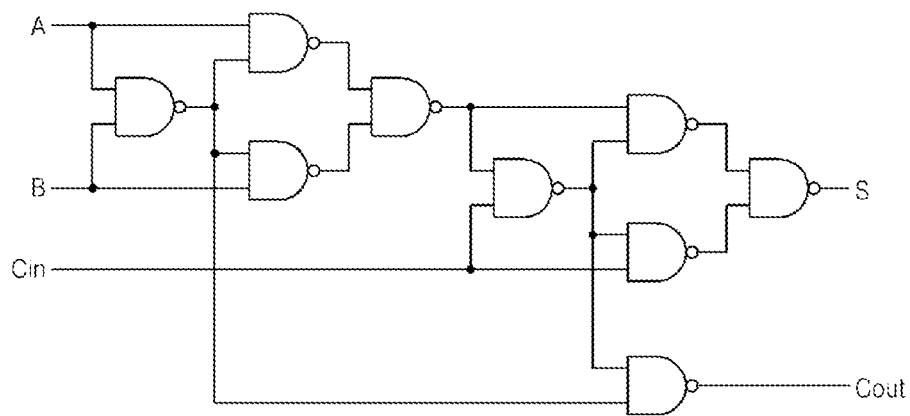
FIGS. 13 through 15 are circuit diagrams of a logic device, according to another example embodiment.
Figure 14:
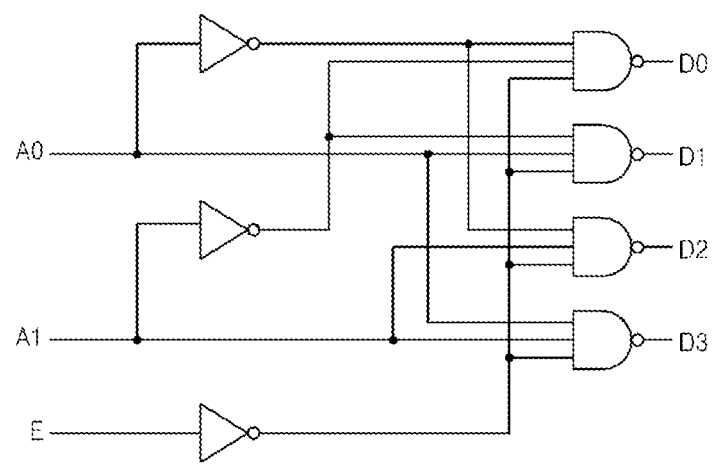
Figure 15:
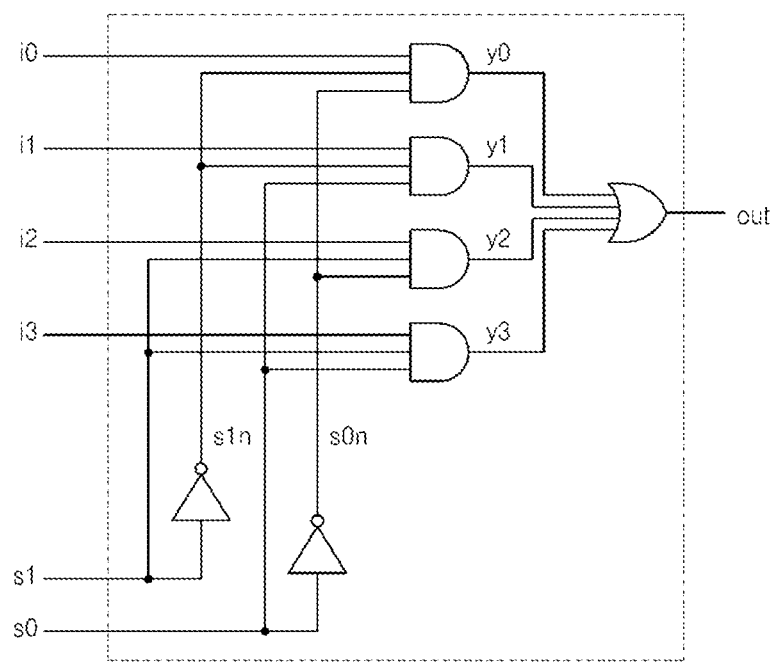

FIGS. 13 through 15 are circuit diagrams of a logic device, according to another example embodiment.

FIGS. 13 through 15 illustrate examples of various types of circuits that are embodied by using the NAND device. FIG. 13 illustrates a full adder circuit using the NAND device, FIG. 14 illustrates a decoder circuit using the NAND device, and FIG. 15 illustrates a multiplexer circuit using the NAND device.

As described above, the logic device according to the one or more example embodiments may be embodied by using the NAND device, and the NAND device may be embodied by using the tunable diode device. Thus, it is possible to understand that various types of circuits may be embodied by using the tunable diode device.

When the various types of circuits are embodied by using the tunable diode device formed of the graphene material shown in FIG. 2, an empty space in a hexagonal structure of the graphene material may function as a buffer, so that the various types of circuits may have an excellent characteristic against shock. When a circuit is embodied by using the graphene material, the circuit has excellent flexibility so that electric conductivity of the circuit is not decreased although the circuit is bent or extended, thus, flexible electronic devices may be easily embodied. The circuit embodied by using the graphene material may realize transparent electronic devices.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. An inverter device including an input terminal and an output terminal, the inverter device configured to invert a signal from the input terminal and output an inverted signal at the output terminal, and the inverter device comprising:
    a diode device including a control terminal connected to the input terminal of the inverter device, an anode terminal connected to a logic high-level voltage terminal, and a cathode terminal connected to the output terminal of the inverter device; and
    a resistive device between the output terminal and a low-level voltage terminal,
    wherein the diode device is configured to turn on or off according to a voltage applied to the control terminal,
    wherein built-potential in the diode device is changed according to the voltage applied to the control terminal,
    wherein the diode device is configured to turn on when a voltage larger than the built-potential is applied between the anode terminal and the cathode terminal, and
    wherein when a low-level voltage is applied to the input terminal, the diode device is turned on, and a current path is formed from the logic high-level voltage terminal to the resistive device such that output a logic high-level voltage from the logic high-level voltage terminal is output to the output terminal, and when a high-level voltage is applied to the input terminal, the diode device is turned off, and a current path is formed from the low-level voltage terminal to the resistive device such that a logic low-level voltage from the logic high-level voltage terminal is output to the output terminal.

2. The inverter device of claim 1, wherein, when the low-level voltage is applied to the control terminal, the diode device is turned on, and when the logic high-level voltage is applied to the control terminal, the diode device is turned off.

3. The inverter device of claim 2, wherein, when the low-level voltage is applied to the input terminal, the diode device is turned on, such that the logic high-level voltage from the logic high-level voltage terminal is output to the output terminal, and when the high-level voltage is applied to the input terminal, the diode device is turned off, such that the low-level voltage from the low-level voltage terminal is output to the output terminal.

4. The inverter device of claim 1, wherein the resistive device is connected directly between the output terminal and the low-level voltage terminal.

5. A logic device comprising the inverter device of claim 1.

6. The inverter device of claim 1, wherein the diode device includes a graphene material.

7. A tunable inverter device, comprising:
an input terminal;
an output terminal;
a diode device including a control terminal connected to an input terminal of the tunable inverter device, an anode terminal configured to receive a control signal, and a cathode terminal connected to the output terminal of the tunable inverter device;
a resistive device between the output terminal and a low-level voltage terminal,
wherein the diode device is configured to turn on or off according to a voltage of the control signal and a voltage applied to the control terminal,
wherein when a low-level voltage is applied to the input terminal, the diode device is turned on, and a current path is formed from the logic high-level voltage terminal to the resistive device such that output a logic high-level voltage is output to the output terminal, and when a high-level voltage is applied to the input terminal, the diode device is turned off, and a current path is formed from the low-level voltage terminal to the resistive device such that a logic low-level voltage from the low-level voltage terminal is output to the output terminal.

8. The controlled inverter device of claim 7, wherein the control signal is a reference voltage.

9. The controlled inverter device of claim 7, wherein the control signal is a logic high-level voltage.

10. The controlled inverter device of claim 7, wherein the diode device includes a graphene material.

* * * * *